US010483981B2

(12) United States Patent
Haraden et al.

(10) Patent No.: US 10,483,981 B2
(45) Date of Patent: Nov. 19, 2019

(54) HIGHSPEED/LOW POWER SYMBOL COMPARE

(71) Applicant: Microsoft Technology Licensing, LLC, Redmond, WA (US)

(72) Inventors: Ryan S. Haraden, Duvall, WA (US); Shankar S. Narayan, Saratoga, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 244 days.

(21) Appl. No.: 15/640,146

(22) Filed: Jun. 30, 2017

(65) Prior Publication Data

US 2018/0191354 A1 Jul. 5, 2018

Related U.S. Application Data

(60) Provisional application No. 62/440,539, filed on Dec. 30, 2016.

(51) Int. Cl.
*G06F 15/82* (2006.01)
*H03K 19/20* (2006.01)
*H03K 5/22* (2006.01)
*G06F 15/76* (2006.01)

(52) U.S. Cl.
CPC ............ *H03K 19/20* (2013.01); *G06F 15/76* (2013.01); *G06F 15/82* (2013.01); *H03K 5/22* (2013.01)

(58) Field of Classification Search
CPC .......... H03K 5/22; H03K 19/20; G06F 15/76; G06F 15/82

USPC ............................................................ 327/1
See application file for complete search history.

(56) References Cited

U.S. PATENT DOCUMENTS

| 4,053,871 | A | * | 10/1977 | Vidalin ............. G06F 16/90348 |
|           |   |   |         | 340/146.2 |
| 4,384,291 | A |   | 5/1983  | Lewis et al. |
| 5,004,932 | A |   | 4/1991  | Nejime |
| 5,056,037 | A |   | 10/1991 | Eberhardt |
| 5,525,982 | A |   | 6/1996  | Cheng et al. |

(Continued)

OTHER PUBLICATIONS

Kennedy, et al., "Ultra-High Throughput String Matching for Deep Packet Inspection", In Proceedings of Design, Automation & Test in Europe Conference & Exhibition, Mar. 8, 2010, 6 pages.

(Continued)

*Primary Examiner* — William Hernandez
(74) *Attorney, Agent, or Firm* — Alleman Hall Creasman & Tuttle LLP

(57) ABSTRACT

An integrated circuit includes a pipeline of compare logic stages. The pipeline, at successive pipeline stages, determines whether each of a set of input symbols meets a corresponding programmable criteria. The compare logic stages each compare the set of input symbols to a respective programmable value. The compare logic stages also each provide, to a respective successive compare logic stage, a corresponding plurality of indicators of whether respective ones of the set of input symbols met the corresponding programmable criteria for that compare logic stage. The corresponding programmable criteria are configurable to be based at least in part on the corresponding plurality of indicators from a respective previous compare logic stage.

20 Claims, 7 Drawing Sheets

(56) References Cited

U.S. PATENT DOCUMENTS

| | | | |
|---|---|---|---|
| 5,699,117 | A | 12/1997 | Uramoto et al. |
| 5,929,791 | A | 7/1999 | Masenas |
| 6,269,352 | B1 | 7/2001 | Fabbrizio et al. |
| 6,591,384 | B1 * | 7/2003 | Chou .............. G11C 29/26 365/201 |
| 7,093,023 | B2 | 8/2006 | Lockwood et al. |
| 7,243,165 | B2 * | 7/2007 | Kravec ........... G06K 9/00986 382/181 |
| 7,502,464 | B2 | 3/2009 | Macchetti et al. |
| 8,819,217 | B2 | 8/2014 | Hussain et al. |
| 9,159,114 | B2 | 10/2015 | Dewangan et al. |
| 9,174,123 | B2 | 11/2015 | Nasiri et al. |
| 9,251,440 | B2 | 2/2016 | Ruehle |
| 9,311,595 | B1 | 4/2016 | Hoffmann |
| 9,450,606 | B1 | 9/2016 | Winter |
| 2005/0243818 | A1 * | 11/2005 | Foglar ............... H04L 45/60 370/389 |
| 2009/0232482 | A1 | 9/2009 | Ju |
| 2013/0099947 | A1 | 4/2013 | Dickie et al. |
| 2013/0290646 | A1 | 10/2013 | Greenwood et al. |
| 2014/0156790 | A1 | 6/2014 | Gopal et al. |
| 2018/0081591 | A1 | 3/2018 | Maheshwari et al. |
| 2018/0173642 | A1 | 6/2018 | Vattakandy et al. |

OTHER PUBLICATIONS

"Non Final Office Action Issued in U.S. Appl. No. 15/609,759", dated Mar. 22, 2019, 8 Pages.

"Non Final Office Action Issued in U.S. Appl. No. 15/640,079", dated Apr. 4, 2019, 11 Pages.

* cited by examiner

HIGHSPEED/LOW POWER SYMBOL COMPARE

RELATED APPLICATIONS

This application claims the benefit of U.S. Application Ser. No. 62/440,539, filed Dec. 30, 2016, the contents of which are incorporated herein by reference in its entirety for all purposes.

BACKGROUND

In machine learning and pattern recognition, a feature may be a measured property or quantity of a phenomenon being observed. Features are usually numeric, but structural features such as strings and graphs are used in syntactic pattern recognition. Feature extraction is typically performed on an input data set and the results provided to recognition/selection hardware for further processing. For example, to perform character recognition, features applied to, for example, a neural network may include histograms that count the number of black pixels along horizontal and vertical directions, number of internal holes, and/or stroke detection. For speech recognition, features for recognizing phonemes can include noise ratios, length of sounds, relative power, and/or filter matches. For spam detection, features may include the presence or absence of certain email headers, the email structure, the language, the frequency of specific terms, and/or the grammatical correctness of the text. For computer vision applications, possible features include edges and objects.

SUMMARY

Examples discussed herein relate to an integrated circuit that includes first compare logic and second compare logic. The first compare logic is to determine, during a first stage, whether each of a first plurality of input symbols meet a first programmable criteria. The second compare logic is to determine, during a second stage, whether each of the first plurality of input symbols meets a second programmable criteria. The second compare logic receives, from the first compare logic, a corresponding plurality of indicators of whether each of the first plurality of input symbols met the first programmable criteria. The first compare logic also determines, during the second stage, whether each of a second plurality of input symbols meets the first programmable criteria.

In another example, a method of extracting features from a stream of data includes determining, in a first pipeline stage, whether each of a first plurality of input symbols from the stream of data meets a first programmable criteria. A corresponding plurality of indicators of whether each of the first plurality of input symbols met the first programmable criteria is received. In a second pipeline stage and concurrently with the operation of the first stage to determine whether the second plurality of symbols meet the first programmable criteria, it is determined whether each of the first plurality of input symbols from the stream of data meets a second programmable criteria. In the first pipeline stage, it is determined whether each of a second plurality of input symbols meets the first programmable criteria.

In another example, an integrated circuit includes a pipeline of compare logic stages. The pipeline, at successive pipeline stages, determines whether each of a set of input symbols meets a corresponding programmable criteria. The compare logic stages each compare the set of input symbols to a respective programmable value. The compare logic stages also each provide, to a respective successive compare logic stage, a corresponding plurality of indicators of whether respective ones of the set of input symbols met the corresponding programmable criteria for that compare logic stage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

To perform symbol comparisons for feature extraction, a pipeline of compare logic stages are employed. Each compare logic stage operates on multiple input symbols, in parallel, to determine whether each of the multiple input symbols individually meets a programmable criteria (e.g., equal to, less than, etc.) The results of these determinations are counted/accumulated over an entire block of input symbols to be used as feature inputs to recognition/selection hardware. The results of these determinations may also be used by successive stages of the pipeline. The determinations may be used by successive stages of the pipeline in order to extract complex features that involve, for example, sequences of multiple input symbols (e.g., find the number of times "Microsoft" appears in a text file.)

Figure 1:
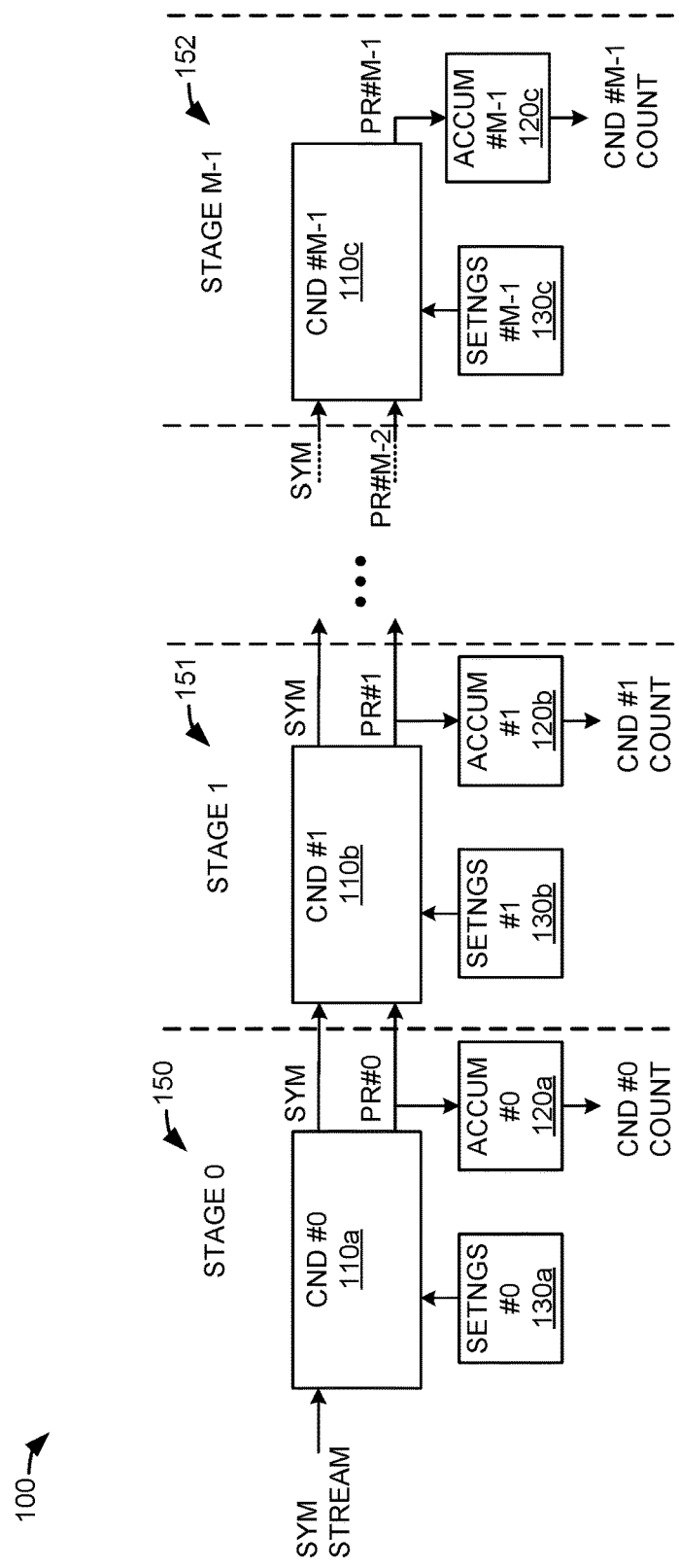
FIG. 1 is a block diagram illustrating a feature extraction pipeline.

FIG. 1 is a block diagram illustrating a feature extraction pipeline. In FIG. 1, feature extraction system 100 comprises M number of pipeline stages (stage 0 150 to stage M−1 152.) Stage 0 150 includes condition block 110a, accumulator 120a, and settings 130a. Stage 1 151 includes condition block 110b, accumulator 120b, and settings 130b. Stage M−1 152 includes condition block 110c, accumulator 120c, and settings 130c. Other stages (e.g., stages 2 to M−2) may be present but are omitted herein for the sake of brevity.

Stage 0 150 (and condition block 110a, in particular) receives a stream of symbols. In an embodiment, the stream of symbols received by stage 0 150 corresponds to a stream of 8-bit values (characters.) Stage 0 150 receives and processes the stream of symbols one symbol at a time before passing results to the next stage (i.e., stage 1 151) for processing. Settings 130a are provided to condition block 110a of stage 0 150. Settings 130a, which are programmable/configurable, determine the conditions/criteria a given symbol being processed by stage 0 150 must meet in order to increment accumulator 120a of stage 0 150.

For example, settings 130a can configure stage 0 150 to increment accumulator 120a each time the letter "A" appears in the input symbol stream. In another example, settings 130a can configure stage 0 150 to increment accumulator 120a each time the input symbol is greater than a programmed value (e.g., 127.)

In addition to incrementing accumulator 120a when an input symbol meets the programmed criteria of stage 0 150, stage 0 150 passes an indicator (a.k.a., Prior #0 and/or PR #0) of whether the condition was met to the next stage in the pipeline. Stage 1 151 (and condition block 110b, in particular) also receives the stream of symbols. Stage 1 151 receives the same stream of symbols as was received by stage 0 150, but delays processing by one symbol such that stage 1 151 has the result (PR #0) from stage 0 150 in time for stage 1 151 to use that result while processing the next symbol (and result from stage 0 150).

For example, take the input string "A", then "B", then "C." Stage 1 151 will process the letter "B" along with the result of stage 0 's 150 operation on the letter "A". While stage 1 151 is processing the letter "B", stage 0 150 will be processing the letter "C", and so on. This may be accomplished, for example, by stage 0 150 passing each symbol to stage 1 150 along with the corresponding result of stage 0 150.

Stage 1 151 receives and processes the stream of symbols and results one symbol and result at a time. Settings 130b are provided to condition block 110b of stage 1 151. Settings 130b, which are programmable/configurable, determine the conditions/criteria a given symbol being processed by stage 1 151 must meet in order to increment accumulator 120b of stage 1 151. Stages 2 through M−1 152 operate in a similar manner with each stage receiving a result from the immediately preceding stage in time to process that result along with processing the next symbol.

In an embodiment, each condition block 110a-110c processes a symbol (character) that is 8 bits (1 byte). Each symbol is processed by a given condition block independent of the other symbols in the stream. Settings 130a-130c can configure a respective condition block 110a-110c to compare (e.g., >=, <=, <, and =) a programmed value to the current input symbol. Settings 130a-130c can also configure a respective condition block 110a-110c to only indicate a successful compare if the prior or current symbol (programmable) met the criteria(s) tested in the preceding stage. In an embodiment, M=16 and accumulators 120a-120c saturate at 127 (7-bits.)

To illustrate the operation of system 100, consider an embodiment where M=4 (i.e., 4 stages) and the input symbols are 8-bit characters. The stages of system 100 can be programmed as given in Table 1 to count the multi-character strings "hi" and "th".

TABLE 1

| Stage # | Type of compare | Character value to compare | Depends on prior stage indicating success? |
|---|---|---|---|
| 0 | is equal to? | 'h' | no |
| 1 | is equal to? | 'i' | yes |
| 2 | is equal to? | 't' | no |
| 3 | is equal to? | 'h' | yes |

When system 100 is presented with the input symbol stream of "hi theo, thanks for coming", Table 2 gives the resulting feature counts (i.e., outputs of system 100) as reflected in accumulators 120a-120c.

TABLE 2

| Stage # | Final accumulator (120) value | Reason |
|---|---|---|
| 0 | 3 | three (3) total number of h's in the stream |
| 1 | 1 | 'i' with an 'h' immediately preceding occurs only once |
| 2 | 2 | two (2) 't' total number of t's in the stream |
| 3 | 2 | 'h' with a 't' immediately preceding occurs twice |

Figure 2:
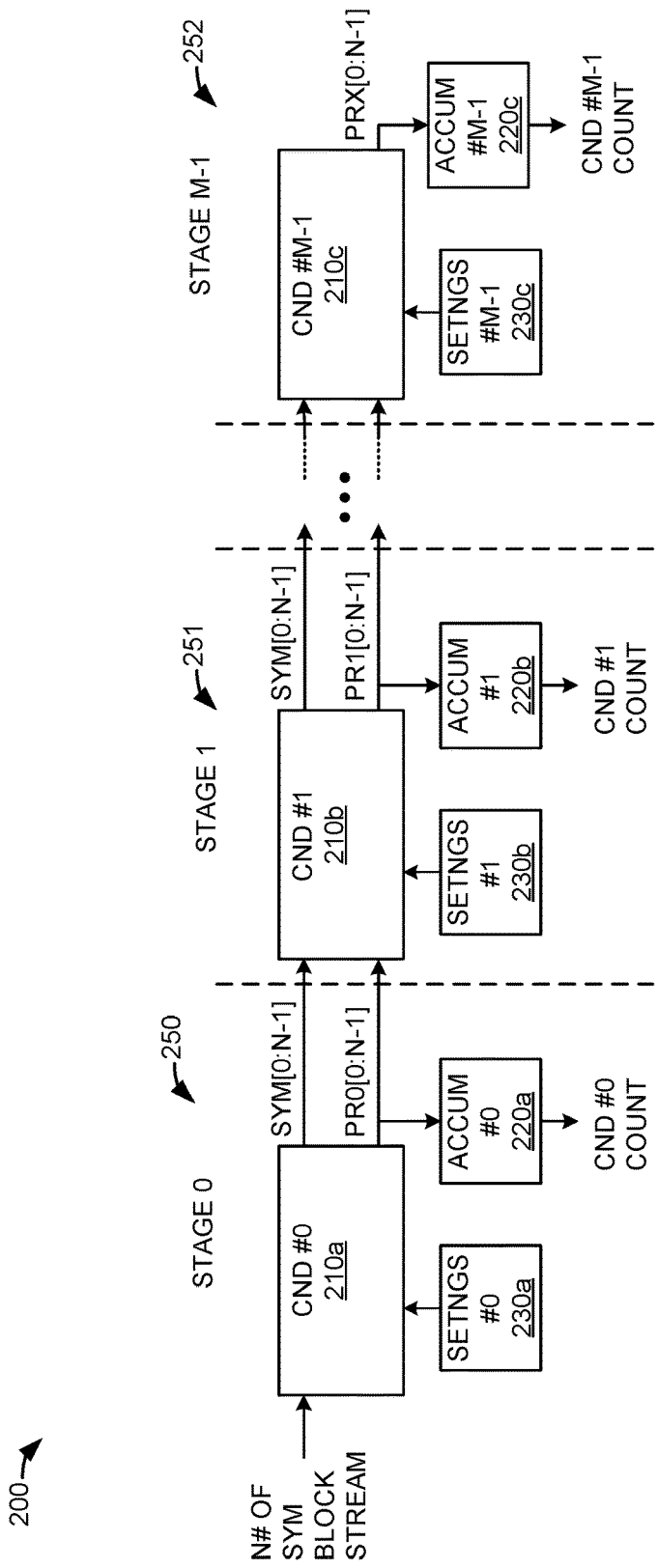
FIG. 2 is a block diagram illustrating a pipeline of compare logic stages.

FIG. 2 is a block diagram illustrating a pipeline of compare logic stages. In FIG. 2, feature extraction system 200 comprises M number of pipeline stages (stage 0 250 to stage M−1 252.) Stage 0 250 includes condition block 210a, accumulator 220a, and settings 230a. Stage 1 251 includes condition block 210b, accumulator 220b, and settings 230b. Stage M−1 252 includes condition block 210c, accumulator 220c, and settings 230c. Other stages (e.g., stages 2 to M−2) may be present but are omitted herein for the sake of brevity. Condition blocks 210a-210c are similar to condition blocks 110a-11-c of system 100 except that condition blocks 210a-210c (and thus the stages of system 200) process multiple (e.g., N number) symbols from the input stream in parallel. For example, if N=8, then condition blocks 210a-210c each process up to eight symbols from the input stream concurrently and pass up to eight result indicators to the next stage.

Stage 0 250 (and condition block 210a, in particular) receive a stream of symbols. Stage 0 250 (and condition block 210a, in particular) receive and process the stream of symbols in 8 symbol blocks. In an embodiment, stage 0 250 receives and processes the stream of symbols eight symbols at a time before passing eight result indicators to the next stage (i.e., stage 1 251) for processing. Settings 230a are provided to condition block 210a of stage 0 250. Settings 230a, which are programmable/configurable, determine the conditions/criteria a given symbol being processed by stage 0 250 must meet in order to increment accumulator 220a of stage 0 250 by one. Since eight symbols are processed at a time by stage 0 250, the count in accumulator 220a may be increased by as much as eight for each eight symbol block that is processed by stage 0 250.

In addition to increasing accumulator 220*a* for each input symbol that meets the programmed criteria of stage 0 250, stage 0 250 passes a corresponding indicator (a.k.a., PR0[0: N−1]) of whether the condition for that corresponding symbol was met to the next stage in the pipeline. Stage 1 251 (and condition block 210*b*, in particular) also receives the stream of symbols. Stage 1 251 receives the same stream of symbols as was received by stage 0 250, but delays processing by one processing cycle (i.e., the time to process the 8 symbols in parallel) such that stage 1 251 has the results (PR0[0:N−1]) from stage 0 250 in time for stage 1 251 to use those results while processing the block of symbols (and results from stage 0 250).

Stage 1 251 receives and processes the stream of symbols and results N symbols and N results at a time. Settings 230*b* are provided to condition block 210*b* of stage 1 251. Settings 230*b*, which are programmable/configurable, determine the conditions/criteria a given symbol being processed by stage 1 251 must meet in order to increase the count in accumulator 220*b* of stage 1 251. Stages 2 through M−1 252 operate in a similar manner with each stage receiving the N number of results from the immediately preceding stage in time to process those results along with processing the next N symbols.

In an embodiment, each condition block 210*a*-210*c* process N number of symbols (character) that are each 8 bits (1 byte). Each symbol is processed by a given condition block independent of the other symbols in the block of N symbols. Settings 230*a*-230*c* can configure a respective condition block 210*a*-210*c* to compare (e.g., >=, <=, <, and =) a programmed value to the N number of input symbols. Settings 230*a*-230*c* can also configure a respective condition block 210*a*-210*c* to only indicate a successful compare if the prior or current symbol (programmable) met the criteria(s) tested in the preceding stage. In an embodiment, M=16 and accumulators 220*a*-220*c* saturate at 127 (7-bits.)

It should be understood from the foregoing discussion that with a fixed input data width of N characters, comparing multiple characters in parallel helps prevent the slowing, halting, and/or repeating the flow of data when the input data is streamed. In addition, because the stages 250-252 do not need to retain the input data after they operate (e.g., compare) on a given block of N symbols, a power savings is realized.

As described herein, each stage 250-252 performs the following steps for each input symbol: (1) the input data is compared to determine whether a first condition (<, >, =, etc.) is met; (2) if programmed to do so, it is determined whether a second condition (e.g., prior condition was met?) is satisfied; (3) if the programmed conditions were met, the accumulator is incremented. Since there are N symbols processed in parallel by each stage 250-252, the accumulator may be increased by as much as N for each block of N symbols that are processed.

To further illustrate the operation of system 200, consider an embodiment where M=4 (i.e., 4 stages 250-252) and the input symbols are 8-bit characters. As in the previous example, the stages of system 200 can be programmed as given in Table 1 to count the multi-character strings "hi" and "th". When system 200 is presented with the input symbol stream of "hi theo, thanks for coming", the input stream is processed in 8 character blocks. Tables 3.0.1 to 3.3.7 illustrate the resulting operations of the stages.

$1^{st}$ Cycle/Iteration:

TABLE 3.0.1

$1^{st}$ cycle/iteration—Stage 0 (250),

| | Lane # | | | | | | | |
|---|---|---|---|---|---|---|---|---|
| | 0 | 1 | 2 | 3 | 4 | 5 | 6 | 7 |
| Input symbol | h | i | ' ' | t | h | e | o | , |
| compare | ="h"? | ="h"? | ="h"? | ="h"? | ="h"? | ="h"? | ="h"? | ="h"? |
| Result out | Yes* | no | no | no | Yes* | no | no | No (latch) |

*add +2 to stage #0 accumulator 220a; total = 2.

$2^{nd}$ Cycle/Iteration:

TABLE 3.0.2

$2^{nd}$ cycle/iteration -- Stage 0 (250),

| | Lane # | | | | | | | |
|---|---|---|---|---|---|---|---|---|
| | 0 | 1 | 2 | 3 | 4 | 5 | 6 | 7 |
| Input symbol | ' ' | t | h | a | n | k | s | ' ' |
| compare | ="h"? | ="h"? | ="h"? | ="h"? | ="h"? | ="h"? | ="h"? | ="h"? |
| Result out | no | no | Yes* | no | no | no | no | No (latch) |

*add +1 to stage #0 accumulator 220a; total = 3.

TABLE 3.1.2

$2^{nd}$ cycle/iteration -- Stage 1 (251)

| | Lane # | | | | | | | |
|---|---|---|---|---|---|---|---|---|
| | 0 | 1 | 2 | 3 | 4 | 5 | 6 | 7 |
| Input symbol | h | i | ' ' | t | h | e | o | , |
| compare | ="i"? | ="i"? | ="i"? | ="i"? | ="i"? | ="i"? | ="i"? | ="i"? |
| Depend on prior stage's result? | yes | yes | yes | yes | yes | yes | yes | yes |
| Prior result | No[1] | yes | no | no | no | yes | no | no |
| Result out | no | Yes* | no | no | no | no | no | No (latch) |

[1]From: lane 7, stage 0, $1^{st}$ cycle/iteration (table 3.0.1)
*add +1 to stage #1 accumulator 220b; total = 1

$3^{rd}$ Cycle/Iteration:

TABLE 3.0.3

$3^{rd}$ cycle/iteration -- Stage 0 (250)

| | Lane # | | | | | | | |
|---|---|---|---|---|---|---|---|---|
| | 0 | 1 | 2 | 3 | 4 | 5 | 6 | 7 |
| Input symbol | f | o | r | ' ' | c | o | m | i |
| compare | ="h"? | ="h"? | ="h"? | ="h"? | ="h"? | ="h"? | ="h"? | ="h"? |
| Result out | no | no | no | no | no | no | no | No (latch) |

TABLE 3.1.3

3rd cycle/iteration -- Stage 1 (251)

| | Lane # | | | | | | | |
|---|---|---|---|---|---|---|---|---|
| | 0 | 1 | 2 | 3 | 4 | 5 | 6 | 7 |
| Input symbol | '' | t | h | a | n | k | s | '' |
| compare | ="i"? | ="i"? | ="i"? | ="i"? | ="i"? | ="i"? | ="i"? | ="i"? |
| Depend on prior stage's result? | yes | yes | yes | yes | yes | yes | yes | yes |
| Prior result | No[2] | no | no | no | no | no | no | no |
| Result out | no | no | no | no | no | no | no | No (latch) |

[2]From: lane 7, stage 0, 2$^{nd}$ cycle/iteration (table 3.0.2)

TABLE 3.2.3

3rd cycle/iteration -- Stage 2

| | Lane # | | | | | | | |
|---|---|---|---|---|---|---|---|---|
| | 0 | 1 | 2 | 3 | 4 | 5 | 6 | 7 |
| Input symbol | h | i | '' | t | h | e | o | , |
| compare | ="t"? | ="t"? | ="t"? | ="t"? | ="t"? | ="t"? | ="t"? | ="t"? |
| Depend on prior stage's result? | no | no | no | no | no | no | no | no |
| Prior result | No[2] | no | yes | no | no | no | no | no |
| Result out | no | no | no | Yes* | no | no | no | No (latch) |

[2]From: lane 7, stage 1, 2$^{nd}$ cycle/iteration (table 3.1.2)

*add +1 to stage #2 accumulator; total = 1

4$^{th}$ Cycle/Iteration:

TABLE 3.0.4

4$^{th}$ cycle/iteration -- Stage 0 (250)

| | Lane # | | | | | | | |
|---|---|---|---|---|---|---|---|---|
| | 0 | 1 | 2 | 3 | 4 | 5 | 6 | 7 |
| Input symbol | n | g | | | | | | |
| compare | ="h"? | ="h"? | ="h"? | ="h"? | ="h"? | ="h"? | ="h"? | ="h"? |
| Result out | no | no | no | no | no | no | no | No (latch) |

TABLE 3.1.4

4$^{th}$ cycle/iteration -- Stage 1 (251)

| | Lane # | | | | | | | |
|---|---|---|---|---|---|---|---|---|
| | 0 | 1 | 2 | 3 | 4 | 5 | 6 | 7 |
| Input symbol | f | o | r | '' | c | o | m | i |
| compare | ="i"? | ="i"? | ="i"? | ="i"? | ="i"? | ="i"? | ="i"? | ="i"? |
| Depend on prior stage's result? | yes | yes | yes | yes | yes | yes | yes | yes |
| Prior result | No[2] | no | no | no | no | no | no | no |
| Result out | no | no | no | no | no | no | no | No (latch) |

[2]From: lane 7, stage 0, 3$^{rd}$ cycle/iteration (table 3.0.3)

TABLE 3.2.4

4$^{th}$ cycle/iteration -- Stage 2

| | Lane # | | | | | | | |
|---|---|---|---|---|---|---|---|---|
| | 0 | 1 | 2 | 3 | 4 | 5 | 6 | 7 |
| Input symbol | '' | t | h | a | n | k | s | '' |
| compare | ="t"? | ="t"? | ="t"? | ="t"? | ="t"? | ="t"? | ="t"? | ="t"? |
| Depend on prior stage's result? | no | no | no | no | no | no | no | no |
| Prior result | No[2] | no | yes | no | no | no | no | no |
| Result out | no | Yes | no | no | no | no | no | No (latch) |

[2]From: lane 7, stage 1, 3$^{rd}$ cycle/iteration (table 3.1.3)

*add +1 to stage #2 accumulator: total = 2.

TABLE 3.3.4

4$^{th}$ cycle/iteration -- Stage 3

| | Lane # | | | | | | | |
|---|---|---|---|---|---|---|---|---|
| | 0 | 1 | 2 | 3 | 4 | 5 | 6 | 7 |
| Input symbol | h | i | '' | t | h | e | o | , |
| compare | ="h"? | ="h"? | ="h"? | ="h"? | ="h"? | ="h"? | ="h"? | ="h"? |
| Depend on prior stage's result? | yes | yes | yes | yes | yes | yes | yes | yes |
| Prior result | No[2] | no | no | no | yes | no | no | no |
| Result out | no | no | no | no | Yes* | no | no | No (latch) |

[2]From: lane 7, stage 2, 3$^{rd}$ cycle/iteration (table 3.2.3)

*add +1 to stage #3 accumulator 220c; total = 1.

5th Cycle/Iteration:

TABLE 3.1.5

5th cycle/iteration -- Stage 1 (251)

| | Lane # | | | | | | | |
|---|---|---|---|---|---|---|---|---|
| | 0 | 1 | 2 | 3 | 4 | 5 | 6 | 7 |
| Input symbol | n | g | | | | | | |
| compare | ="i"? | ="i"? | ="i"? | ="i"? | ="i"? | ="i"? | ="i"? | ="i"? |
| Depend on prior stage's result? | yes | yes | yes | yes | yes | yes | yes | yes |
| Prior result | No[2] | no | no | no | no | no | no | no |
| Result out | no | no | no | no | no | no | no | No (latch) |

[2]From: lane 7, stage 0, 4th cycle/iteration (table 3.0.4)

TABLE 3.2.5

5th cycle/iteration -- Stage 2

| | Lane # | | | | | | | |
|---|---|---|---|---|---|---|---|---|
| | 0 | 1 | 2 | 3 | 4 | 5 | 6 | 7 |
| Input symbol | f | o | r | ' ' | c | o | m | i |
| compare | ="t"? | ="t"? | ="t"? | ="t"? | ="t"? | ="t"? | ="t"? | ="t"? |
| Depend on prior stage's result? | no | no | no | no | no | no | no | no |
| Prior result | No[2] | no | yes | no | no | no | no | no |
| Result out | no | no | no | no | no | no | no | No (latch) |

[2]From: lane 7, stage 1, 4th cycle/iteration (table 3.1.4)

TABLE 3.3.5

5th cycle/iteration -- Stage 3

| | Lane # | | | | | | | |
|---|---|---|---|---|---|---|---|---|
| | 0 | 1 | 2 | 3 | 4 | 5 | 6 | 7 |
| Input symbol | ' ' | t | h | a | n | k | s | ' ' |
| compare | ="h"? | ="h"? | ="h"? | ="h"? | ="h"? | ="h"? | ="h"? | ="h"? |
| Depend on prior stage's result? | yes | yes | yes | yes | yes | yes | yes | yes |
| Prior result | No[2] | no | yes | no | no | no | no | no |
| Result out | no | no | Yes* | no | no | no | no | No (latch) |

[2]From: lane 7, stage 2, 4th cycle/iteration (table 3.2.4)
*add +1 to stage #3 accumulator 220c; total = 2.

6th Cycle/Iteration

TABLE 3.2.6

6th cycle/iteration -- Stage 2

| | Lane # | | | | | | | |
|---|---|---|---|---|---|---|---|---|
| | 0 | 1 | 2 | 3 | 4 | 5 | 6 | 7 |
| Input symbol | n | g | | | | | | |
| compare | ="t"? | ="t"? | ="t"? | ="t"? | ="t"? | ="t"? | ="t"? | ="t"? |
| Depend on prior stage's result? | no | no | no | no | no | no | no | no |
| Prior result | No[2] | no | no | no | no | no | no | no |
| Result out | no | no | no | no | no | no | no | No (latch) |

[2]From: lane 7, stage 1, 5th cycle/iteration (table 3.1.4)

TABLE 3.3.6

6th cycle/iteration -- Stage 3

| | Lane # | | | | | | | |
|---|---|---|---|---|---|---|---|---|
| | 0 | 1 | 2 | 3 | 4 | 5 | 6 | 7 |
| Input symbol | f | o | r | ' ' | c | o | m | i |
| compare | ="h"? | ="h"? | ="h"? | ="h"? | ="h"? | ="h"? | ="h"? | ="h"? |
| Depend on prior stage's result? | yes | yes | yes | yes | yes | yes | yes | yes |
| Prior result | No[2] | no | no | no | no | no | no | no |
| Result out | no | no | no | no | no | no | no | No (latch) |

[2]From: lane 7, stage 2, 5th cycle/iteration (table 3.2.5)

TABLE 3.3.7

7th cycle/iteration -- Stage 3

| | Lane # | | | | | | | |
|---|---|---|---|---|---|---|---|---|
| | 0 | 1 | 2 | 3 | 4 | 5 | 6 | 7 |
| Input symbol | n | g | | | | | | |
| compare | ="h"? | ="h"? | ="h"? | ="h"? | ="h"? | ="h"? | ="h"? | ="h"? |
| Depend on prior stage's result? | yes | yes | yes | yes | yes | yes | yes | yes |
| Prior result | No[2] | no | no | no | no | no | no | no |
| Result out | no | no | no | no | no | no | no | No (latch) |

[2]From: lane 7, stage 2, 6th cycle/iteration (table 3.2.6)

As can be established from Tables 3.0.1 to 3.3.7, when system 200 is presented with the input symbol stream of "hi theo, thanks for coming", the results as reflected in accumulators 220a-220c are the same as those given in Table 2. Tables 3.0.1 to 3.3.7 are divided into cycles/iterations where each stage (feature block) is presented with different portions of the input stream from the other stages. In another embodiment, however, each stage could be presented with the same portion of the input stream and the results rippled through multiple stages before being latched and a new portion of the input stream is presented to each stage.

Figure 3:
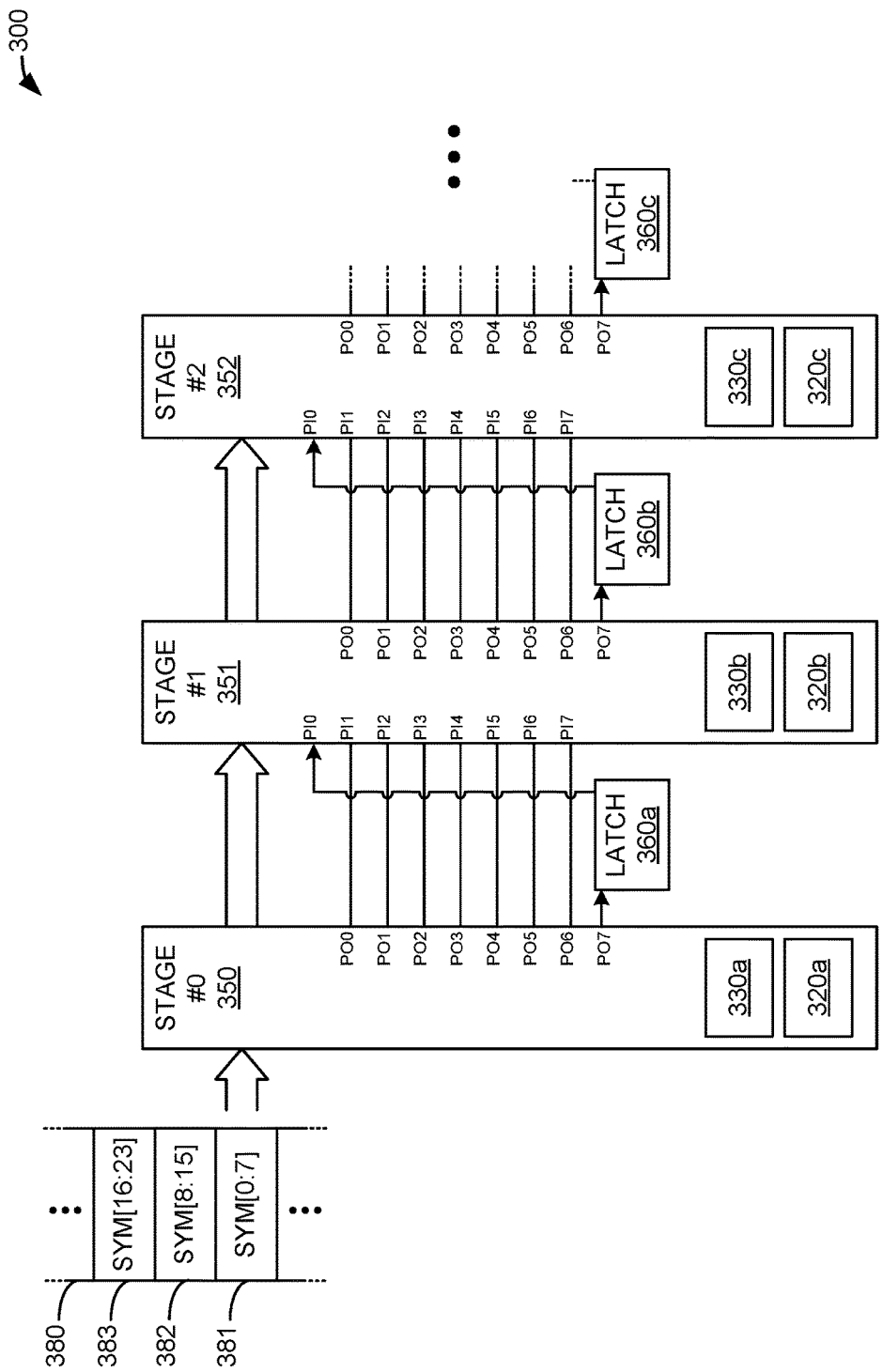
FIG. 3 is a block diagram illustrating an interconnection of a pipeline of compare logic stages.

FIG. 3 is a block diagram illustrating an interconnection of a pipeline of compare logic stages. In FIG. 3, feature extraction system 300 includes stage #0 350, stage #1 351, and stage #2 352. Stages 350-352 of system 300 function as described herein with respect to the pipeline stages of system 200. Other stages may follow stage #2 352, but are omitted herein for the sake of brevity.

Stage #0 350 includes accumulator 320a and settings 330a. Stage #1 351 includes accumulator 320b and settings 330b. Stage #2 352 includes accumulator 320c and settings 330c. Each stage 350-352 is provided a stream of symbols 380 in eight symbol blocks 381-383. Each stage 350-352 outputs eight result indicators (PO0-PO7) that are provided to the next stage in the pipeline. The eight result indicators PO0-PO7 correspond to whether the corresponding input character (e.g., SYM[0:7]) met the criteria programmed (by settings 330a-330c) into the respective stage 350-352. Accumulators 320a-320c count the respective number of times the result indicators PO0-PO7 for that respective stage indicate the conditions programmed into that stage are met.

The results PO0-PO6 from stage #0 350 are input to result inputs PI1-PI7 of stage #1 351. In other words, PO0 from stage #0 350 in input to PI1 of stage #1 351, PO1 is input to PI2, and so on. Result PO7 from stage #0 350 is latched by latch 360a and the latched output provided to PI0 of stage #1 350 one cycle/iteration later. Likewise, the results PO0-PO6 from stage #1 351 are input to result inputs PI1-PI7 of stage #2 352. Result PO7 from stage #1 351 is latched by latch 360b and the latched output provided to PI0 of stage #2 351 one cycle/iteration later. The results output by stage #2 are provided to a successive pipeline stage in a similar manner with PO7 from stage #2 being latched by latch 360c.

Each stage 350-352 performs, or has logic to perform, according to respective settings 330a-330c at least the following steps: (1) determine whether a first condition (e.g., <, >, =, <=, >=) is met; (2) if programmed to do so, determine whether a second condition (e.g., were condition(s) from prior stage met?); (3) If the programmed conditions were met, then increment the respective accumulator 320a-320c. Since there are N symbols processed in parallel by each stage 250-252, the accumulator may be increased by as much as N for each block of N symbols that are processed.

To illustrate, consider the example input "hi Theo," and the following programming: Stage #0 350 is programmed with "h", equal, not dependent on prior result; stage #1 351 is programmed with "i", equal, depend on prior result; and so on with stage #127 being programmed with "5", equal, depend on prior result. Stage #0 350 looks at all 8 characters "hi Theo," in parallel for the first condition "=" (step 0). Stage #0 350 checks the secondary condition "no prior" (step 1). Stage #0 350 counts all the still active conditions (step 2). So the max stage #0 350 could count is the width of the input (for the first cycle). In this example, stage #0 350 adds two to the count in accumulator 320a.

Stage #1 351 looks at all 8 characters "hi Theo," in parallel in for the first condition "=" (step 0). Note that this is the same input stream that stage #0 350 processed in the previous cycle/iteration. Stage #1 351 checks the secondary condition "prior" (step 1). Because of the 'depends on prior' programming, stage #1 351 needs to look at the N-1 output of stage #0 350. The condition was met by the second character, so stage #1 351 needs to look at whether the input met the stage #0 350 condition on the first character. Stage #1 351 counts all the still active conditions (step 2). As with stage #0 350, the max stage #1 351 can increase the count in a cycle is the width of the input. In this example, stage #1 351 adds one to the count in accumulator 320b. These steps, in accordance with their respective settings, 330a-330c proceeds for the other stages #2-#126.

Stage #127 looks at all 8 characters "hi Theo," in parallel in for the first condition "=" (step 0). Note that this is the same input stream that stage #0 350 processed in the first cycle/iteration. Stage #127 checks the secondary condition "prior" (step 1). Because of the 'depends on prior' programming, stage #127 needs to look at the N-1 output of stage #126. If, for example, the condition was met by the second character, stage #127 needs to look at whether the input met the stage #126 condition on the first character. Stage #127 counts all the still active conditions (step 2). As with the other stages 350-352, the max stage #127 can increase the count in a cycle is the width of the input. In this example, there was no "5" in the input stream so the output of stage #126 does not matter.

Figure 4:
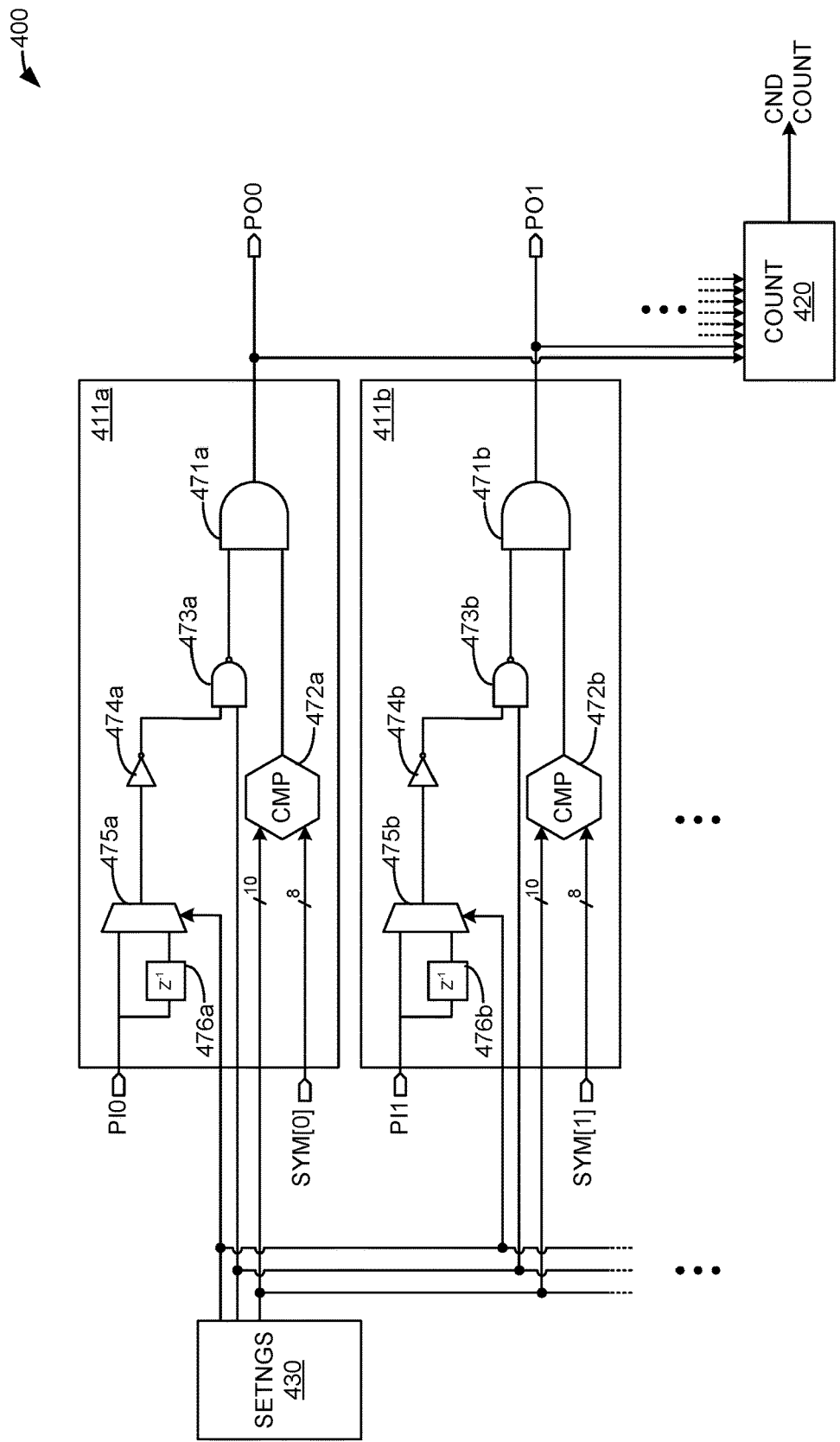
FIG. 4 is a block diagram illustrating a compare logic stage.

FIG. 4 is a block diagram illustrating a compare logic stage. In FIG. 4, compare stage 400 include compare lane 411a and compare lane 411b. Additional compare lanes (e.g., for a total of eight) may be part of stage 400 but are omitted for the sake of brevity. Compare stage 400 may correspond to, for example, condition blocks 210a-210c, stage 0 to M-1 of system 200, stages 350-352, and/or one or more of their components.

Each compare lane 411a-411b receives a respective symbol SYM[0:1], and a respective result PI0, PI1. Compare lane 411a includes AND gate 471a, compare 472a NAND gate 473a, inverter 474a, MUX 475a, and delay latch 476a. Compare 472a receives a symbol SYM[0] and settings bits. In an embodiment, SYM[0] is an eight bit character and settings bits comprise an eight bit value to be compared with SYM[0] and two bits to specify the type of compare (e.g., <=, =, >=, etc.). The output of compare 472a in input to AND 471a. The other input to AND 471a is the output of NAND 473a. NAND 473a receives a bit from settings 430 that specifies whether the results PO0 output from compare stage 400 are dependent upon the results PI0 from a previous stage (e.g., use prior result?). The prior result PI0 input to NAND 473a can be the prior result currently being received or can be the result value from the previous cycle that has been stored and delayed by latch 476a. MUX 475a selects, based on a bit from settings 430, which prior result PI0 value (if any) is used by stage 400.

Likewise, compare lane 411b includes AND gate 471b, compare 472b NAND gate 473a, inverter 474a, MUX 475a, and delay latch 476a. Compare 472b receives a symbol SYM[0] and settings bits. In an embodiment, SYM[1] is an eight bit character and settings bits comprise an eight bit value to be compared with SYM[1] and two bits to specify the type of compare (e.g., <=, =, >=). The output of compare 472b in input to AND 471b. The other input to AND 471b is the output of NAND 473a. NAND 473b receives a bit from settings 430 that specifies whether the results PO1 output from compare stage 400 are dependent upon the results PI1 from a previous stage (e.g., use prior result?). The prior result PI1 input to NAND 473b can be the prior result currently being received or can be the result value from the previous cycle that has been stored and delayed by latch 476b. MUX 475b selects, based on a bit from settings 430, which prior result PI1 value (if any) is used by stage 400. Additional compare lanes (not shown in FIG. 4) function and operate in a similar manner to compare lanes 411a-411b.

The outputs of compare lanes 411a-411b are counted by counter 420. The output of counter 420 is a count of the number of lanes with input symbols (and input results, if used) that meet the criteria specified by settings 430. This count may be further accumulated over multiple cycles/iterations of input symbols SYM[0:1] (and results PI0-PI1, if used.)

It should be understood that delay latches 476a-476b enable compare stage 400 to be programmed to count symbols in a range of values. For example, to count the number of characters in the stream that are between 6 and 15, a first stage (e.g., stage #0 350) can be programmed with "6", greater than, and not dependent on prior result, and a second stage (e.g., stage #1 351) with "15", less than, and dependent of delayed prior result. Thus, stage #1 would use the previous cycles result from stage #0—not the current cycles result. By using the previous cycles result, compare lanes 411a-411b (and thus compare stage 400) may operate faster.

Figure 5:
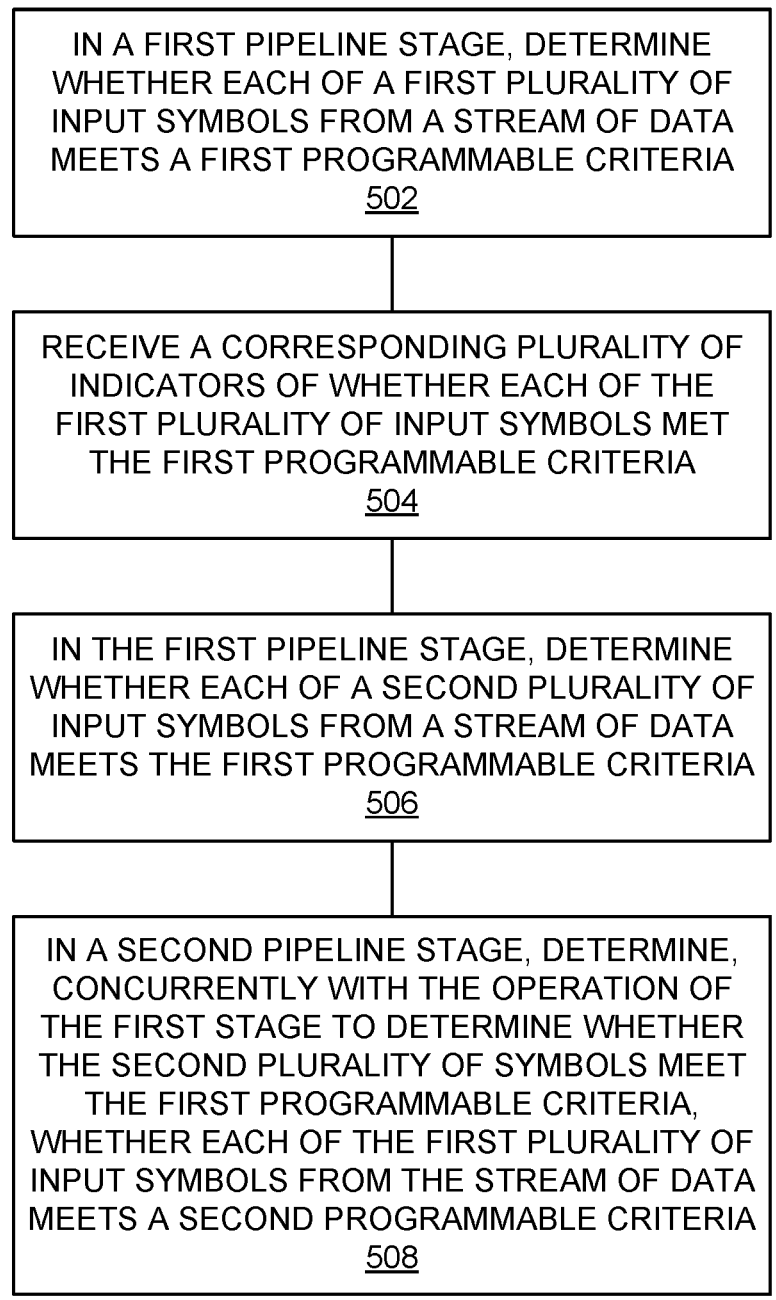
FIG. 5 is a flowchart illustrating a method of extracting features from a stream of data.

FIG. 5 is a flowchart illustrating a method of extracting features from a stream of data. The steps illustrated in FIG. 5 may be performed, for example, by one or more elements of system 200, system 300, stage 400, and/or their components. In a first pipeline stage, it is determined whether each of a first plurality of input symbols from a stream of data meets a first programmable criteria (502). For example, stage 0 250 may determine whether each of N number of symbols applied to the inputs of stage 0 250 meet the criteria determined by settings 230a. For example, stage 0 250 may determine whether each of N symbols input to stage 0 250 is equal to a given ASCII character. In another example, stage #0 350 may determine whether each of SYM[0:7] 381 from data stream 380 that have been applied to the inputs of stage #0 350 meet the criteria determined by settings 330a.

A corresponding plurality of indicators of whether each of the first plurality of input symbols met the first programmable criteria are received (504). For example, stage 1 251 may receive the outputs from stage 250. In another example, stage #1 351 may receive the outputs PO0-PO7 from stage #0 350. In the first pipeline stage, it is determined whether each of a second plurality of input symbols from a stream of data meets the first programmable criteria (506). For example, stage 0 250 may determine whether each of another (i.e., second) N number of symbols applied to the inputs of stage 0 250 meet the criteria determined by settings 230a. For example, stage 0 250 may determine whether each of a second set of N symbols input to stage 0 250 is equal to the given ASCII character. In another example, stage #0 350 may determine whether each of SYM[8:15] 382 from data stream 380 that have been applied to the inputs of stage #0 350 meet the criteria determined by settings 330a.

In a second pipeline stage, it is determined, concurrently with the operation of the first stage to determine whether the second plurality of symbols meet the first programmable criteria, whether each of the first plurality of input symbols from the stream of data meet a second programmable criteria (508). For example, while stage 0 250 is determining whether each of the second set of N number of symbols applied to the inputs of stage 0 250 meet the criteria determined by settings 230a, stage 1 251 may determine whether each of the first set of N number of symbols applied to the inputs of stage 1 251 meet the criteria determined by settings 230b. In another example, while stage #0 350 is determining whether each of SYM[8:15] 382 from data stream 380 that have been applied to the inputs of stage #0 350 meet the criteria determined by settings 330a, stage #1 351 may determine whether each of SYM[0:7] 381 from data stream 380 that have been applied to the inputs of stage #1 351 meet the criteria determined by settings 330b.

Figure 6:
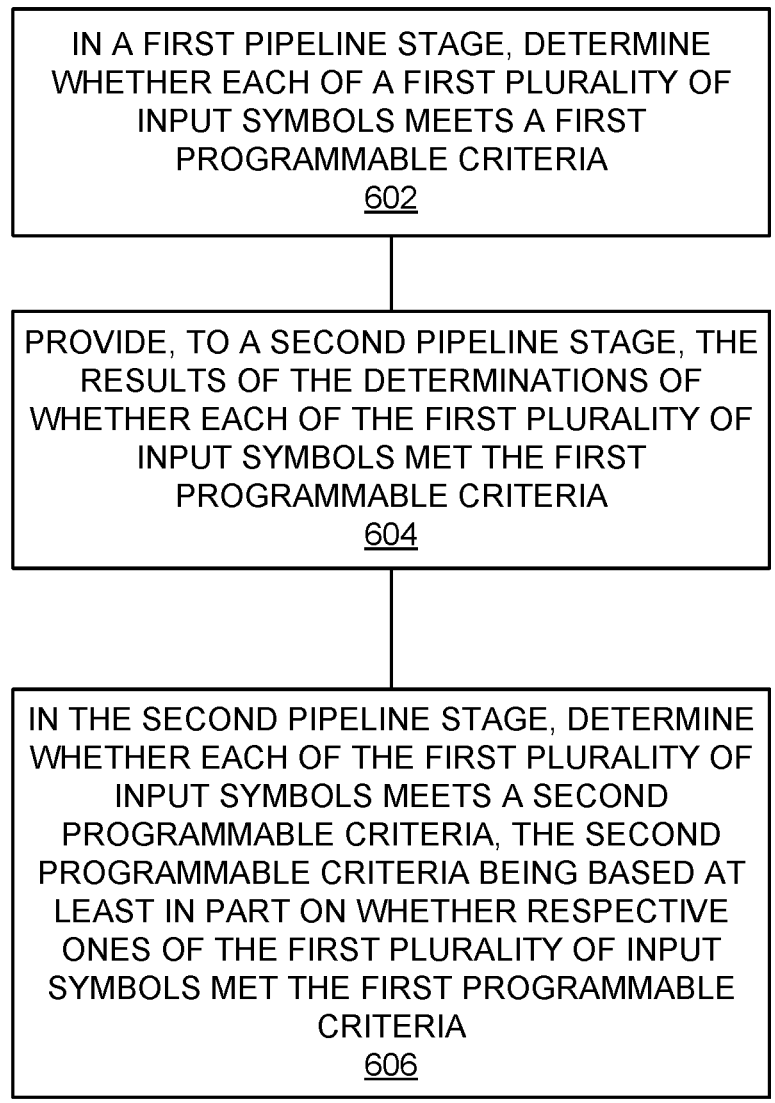
FIG. 6 is a flowchart illustrating a method of operating a pipeline of compare logic stages.

FIG. 6 is a flowchart illustrating a method of operating a pipeline of compare logic stages. The steps illustrated in FIG. 6 may be performed, for example, by one or more elements of system 200, system 300, stage 400, and/or their components. In a first pipeline stage, it is determined wither each of a first plurality of input symbols meets a first programmable criteria (602). For example, stage 0 250 may determine whether each of the symbols applied to the inputs of stage 0 250 meet the criteria determined by settings 230a. In another example, stage #0 350 may determine whether each of SYM[0:7] 381 meet the criteria determined by settings 330a.

The results of the determinations of whether each of the first plurality of input symbols met the first programmable criteria are provided to a second pipeline stage (604). For example, stage 0 250 may provide indicators to the inputs of stage 1 251. In another example, stage #0 350 may provide outputs PO0-PO7 to stage #1 351.

In the second pipeline stage, it is determined whether each of the first plurality of input symbols meets a second programmable criteria where the second programmable criteria is base at least in part on whether respective ones of the first plurality of input symbols met the first programmable criteria (606). For example, stage 1 251 may determine whether each of the symbols applied to the inputs of stage 1 251 meet the criteria determined by settings 230b where the criteria is based at least in part on the results from stage 0 250. In another example, stage #1 351 may determine whether each of SYM[0:7] 381 meet the criteria determined by settings 330b, where the criteria is based on the inputs PI0-PI7 to stage #1 351 that came from stage 0 250's processing of SYM[0:7].

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of one or more elements of system 200, system 300, stage 400, and/or their components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Figure 7:
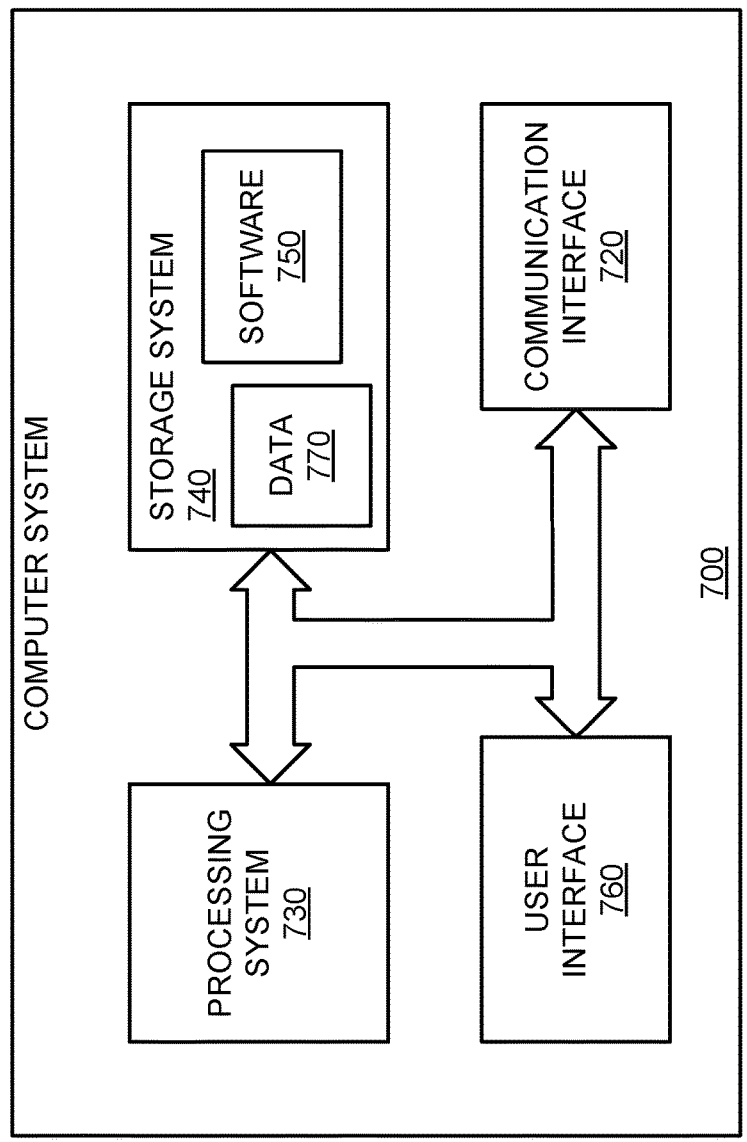
FIG. 7 is a block diagram illustrating a computer system.

FIG. 7 illustrates a block diagram of an example computer system. In an embodiment, computer system 700 and/or its components include circuits, software, and/or data that implement, or are used to implement, the methods, systems and/or devices illustrated in the Figures, the corresponding discussions of the Figures, and/or are otherwise taught herein.

Computer system 700 includes communication interface 720, processing system 730, storage system 740, and user interface 760. Processing system 730 is operatively coupled to storage system 740. Storage system 740 stores software 750 and data 770. Processing system 730 is operatively coupled to communication interface 720 and user interface 760.

Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. User interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, EEPROM, flash memory, network storage, server, or other memory function. Storage system 740 may include computer readable medium. Storage system 740 may be distributed among multiple memory devices.

Processing system 730 retrieves and executes software 750 from storage system 740. Processing system 730 may retrieve and store data 770. Processing system 730 may also retrieve and store data via communication interface 720. Processing system 750 may create or modify software 750 or data 770 to achieve a tangible result. Processing system may control communication interface 720 or user interface 760 to achieve a tangible result. Processing system 730 may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate as described herein.

Implementations discussed herein include, but are not limited to, the following examples:

EXAMPLE 1

An integrated circuit, comprising: a first compare logic to determine, in parallel and during a first stage, whether each of a first plurality of input symbols meets a first programmable criteria; and, a second compare logic to determine, in parallel and during a second stage, whether each of the first plurality of input symbols meets a second programmable criteria, the second compare logic to receive, from the first compare logic, a corresponding plurality of indicators of whether each of the first plurality of input symbols met the first programmable criteria, the first compare logic to determine, during the second stage, whether each of a second plurality of input symbols meets the first programmable criteria.

EXAMPLE 2

The integrated circuit of example 1 wherein the second programmable criteria is based at least in part on the corresponding plurality of indicators of whether each of the first plurality of input symbols met the first programmable criteria.

EXAMPLE 3

The integrated circuit of example 1, wherein the second compare logic is to determine, during a third stage, whether each of the second plurality of input symbols meets the second programmable criteria.

EXAMPLE 4

The integrated circuit of example 3, wherein the second programmable criteria is based at least in part on the corresponding plurality of indicators of whether each of the second plurality of input symbols met the first programmable criteria.

EXAMPLE 5

The integrated circuit of example 1, wherein the first plurality and second plurality of input symbols correspond to eight bit characters.

EXAMPLE 6

The integrated circuit of example 1, wherein the first programmable criteria is a configurable comparison of a programmable value to a respective one of the first plurality input symbols.

EXAMPLE 7

The integrated circuit of example 6, wherein the configurable comparison can be configured to be at least one of greater than, equal to, and less than.

EXAMPLE 8

A method of extracting features from a stream of data, comprising: determining, in a first pipeline stage, whether each of a first plurality of input symbols from the stream of data meet a first programmable criteria; receiving, a corresponding plurality of indicators of whether each of the first plurality of input symbols met the first programmable criteria; determining, in a second pipeline stage and concurrently with the operation of the first pipeline stage to determine whether the second plurality of symbols meet the first programmable criteria, whether each of the first plurality of input symbols from the stream of data meets a second programmable criteria; and, determining, in the first pipeline stage, whether each of a second plurality of input symbols meet the first programmable criteria.

EXAMPLE 9

The method of example 8, wherein the second programmable criteria is based at least in part on the corresponding plurality of indicators of whether each of the first plurality of input symbols met the first programmable criteria.

EXAMPLE 10

The method of example 8, further comprising: determining, in the second pipeline stage, whether each of the second plurality of input symbols meet the second programmable criteria.

EXAMPLE 11

The method of example 10, wherein the second programmable criteria is based at least in part on the corresponding plurality of indicators of whether each of the second plurality of input symbols met the first programmable criteria.

EXAMPLE 12

The method of example 8, wherein the first plurality and second plurality of input symbols correspond to eight bit characters.

Example 13

The method of example 8, further comprising: configuring the first programmable criteria to compare a programmable value to respective ones of the first plurality input symbols.

EXAMPLE 14

The method of example 8, further comprising: selecting the first programmable criteria to be at least one of greater than, equal to, and less than, respective ones of the first plurality input symbols with a programmable value.

EXAMPLE 15

An integrated circuit, comprising: a pipeline of compare logic stages to, at successive pipeline stages, determine whether each of a set of input symbols meets a corresponding programmable criteria; the compare logic stages to each compare the set of input symbols, in parallel, to a respective programmable value; and, a plurality of the compare logic stages to each provide, to a respective successive compare logic stage, a corresponding plurality of indicators of whether respective ones of the set of input symbols met the corresponding programmable criteria for that compare logic stage.

EXAMPLE 16

The integrated circuit of example 15, wherein at least one of the corresponding programmable criteria is configurable to be based at least in part on the corresponding plurality of indicators from a respective previous compare logic stage.

EXAMPLE 17

The integrated circuit of example 15, wherein at least one of the corresponding programmable criteria is configurable to be based at least in part on the corresponding plurality of indicators from that compare logic stage.

EXAMPLE 18

The integrated circuit of example 17, wherein the corresponding plurality of indicators from that compare logic stage are stored indicators from the previous compare logic stage that are associated with the set of input symbols.

EXAMPLE 19

The integrated circuit of example 15, wherein the set of input symbols includes at least eight symbols that are each at least eight bits.

EXAMPLE 20

The integrated circuit of example 15, wherein the compare logic stages are configurable to perform a comparison that is at least one of greater than, equal to, and less than.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. An integrated circuit, comprising:
   first compare logic to determine, in parallel and during a first stage, whether each of a first plurality of input symbols meets a first programmable criteria; and
   second compare logic to determine, in parallel and during a second stage, whether each of the first plurality of input symbols meets a second programmable criteria, the second compare logic to receive, from the first compare logic, a corresponding plurality of indicators of whether each of the first plurality of input symbols met the first programmable criteria, the first compare logic to determine, during the second stage, whether each of a second plurality of input symbols meets the first programmable criteria.

2. The integrated circuit of claim 1 wherein the second programmable criteria is based at least in part on the corresponding plurality of indicators of whether each of the first plurality of input symbols met the first programmable criteria.

3. The integrated circuit of claim 1, wherein the second compare logic is to determine, during a third stage, whether each of the second plurality of input symbols meets the second programmable criteria.

4. The integrated circuit of claim 3, wherein the second programmable criteria is based at least in part on the corresponding plurality of indicators of whether each of the second plurality of input symbols met the first programmable criteria.

5. The integrated circuit of claim 1, wherein the first programmable criteria is a configurable comparison of a programmable value to a respective one of the first plurality input symbols.

6. The integrated circuit of claim 1, wherein the first compare logic is further configured to:
   identify a feature in a data stream; and
   subsequently to the first compare logic determining that each of the first plurality of input symbols meets the first programmable criteria, identify the first plurality of input symbols as including the feature.

7. The integrated circuit of claim 6, wherein the first compare logic is further configured to increment a feature counter subsequently to identifying the first plurality of input symbols as including the feature.

8. A method of extracting features from a stream of data, comprising:
   at an integrated circuit:
      determining, in a first pipeline stage, whether each of a first plurality of input symbols from the stream of data meets a first programmable criteria;
      receiving, a corresponding plurality of indicators of whether each of the first plurality of input symbols met the first programmable criteria;
      after determining whether each of the first plurality of input symbols meets the first programmable criteria:
      determining, in a second pipeline stage, whether each of the first plurality of input symbols from the stream of data meets a second programmable criteria; and
      concurrent with the determining in the second pipeline stage, determining, in the first pipeline stage, whether each of a second plurality of input symbols meets the first programmable criteria.

9. The method of claim 8, wherein the second programmable criteria is based at least in part on the corresponding plurality of indicators of whether each of the first plurality of input symbols met the first programmable criteria.

10. The method of claim 8, further comprising:
    at the integrated circuit:
       determining, in the second pipeline stage, whether each of the second plurality of input symbols meet the second programmable criteria.

11. The method of claim 10, wherein the second programmable criteria is based at least in part on the corresponding plurality of indicators of whether each of the second plurality of input symbols met the first programmable criteria.

12. The method of claim 8, further comprising:
    at the integrated circuit:
       configuring the first programmable criteria to compare a programmable value to respective ones of the first plurality of input symbols.

13. The method of claim 8, further comprising, at the integrated circuit in the first pipeline stage:
    identifying a feature in a data stream; and
    subsequently to determining that each of the first plurality of input symbols meets the first programmable criteria, identifying the first plurality of input symbols as including the feature.

14. The method of claim 13, further comprising:
    at the integrated circuit:
       incrementing a feature counter subsequently to identifying the first plurality of input symbols as including the feature.

15. An integrated circuit, comprising:
    a pipeline of compare logic stages to, at successive pipeline stages, determine whether each of a set of input symbols meets a corresponding programmable criteria;
    the compare logic stages to each compare the set of input symbols, in parallel, to a respective programmable value; and
    a plurality of the compare logic stages to each provide, to a respective successive compare logic stage, a corresponding plurality of indicators of whether respective ones of the set of input symbols met the corresponding programmable criteria for that compare logic stage.

16. The integrated circuit of claim 15, wherein at least one of the corresponding programmable criteria is configurable to be based at least in part on the corresponding plurality of indicators from a respective previous compare logic stage.

17. The integrated circuit of claim 15, wherein at least one of the corresponding programmable criteria is configurable to be based at least in part on the corresponding plurality of indicators from that compare logic stage.

18. The integrated circuit of claim 17, wherein the corresponding plurality of indicators from that compare logic stage are stored indicators from the previous compare logic stage that are associated with the set of input symbols.

19. The integrated circuit of claim 15, wherein the pipeline of compare logic stages is further configured to, at a compare logic stage:
    identify a feature in a data stream; and
    when the respective ones of the set of input symbols meets the corresponding programmable criteria for that compare logic stage, identify the set of input symbols as including the feature.

20. The integrated circuit of claim 19, wherein the pipeline of compare logic stages is further configured to, at a compare logic stage, increment a feature counter subsequently to identifying the set of input symbols as including the feature.

* * * * *